(12) United States Patent
Bögel et al.

(10) Patent No.: US 6,749,699 B2
(45) Date of Patent: Jun. 15, 2004

(54) SILVER CONTAINING COPPER ALLOY

(75) Inventors: Andreas Bögel, Weissenborn (DE);
Jörg Seeger, Ulm (DE); Hans-Achim Kuhn, Illertissen (DE); John F. Breedis, Trumbull, CT (US); Ronald N. Caron, Branford, CT (US); Derek E. Tyler, Cheshire, CT (US)

(73) Assignees: Olin Corporation, Waterbury, CT (US);
Wieland-Werke AG, Ulm (DE)

( * ) Notice: Subject to any disclaimer, the term of this patent is extended or adjusted under 35 U.S.C. 154(b) by 0 days.

(21) Appl. No.: 09/923,137

(22) Filed: Aug. 6, 2001

(65) Prior Publication Data

US 2002/0039542 A1 Apr. 4, 2002

Related U.S. Application Data

(60) Provisional application No. 60/224,054, filed on Aug. 9, 2000.

(51) Int. Cl.$^7$ .................................................. C22C 9/00
(52) U.S. Cl. ........................ 148/432; 420/473; 420/490; 148/433
(58) Field of Search ................................ 148/432, 433, 148/436, 435; 420/470, 473, 490

(56) References Cited

U.S. PATENT DOCUMENTS

| | | |
|---|---|---|
| 2,033,709 A | 3/1936 | Hensel et al. |
| 2,127,596 A | 8/1938 | Hensel et al. |
| 3,677,745 A | 7/1972 | Finlay et al. |
| 3,778,318 A | 12/1973 | Finlay et al. |
| 4,362,579 A | 12/1982 | Tsuji |
| 4,605,532 A | 8/1986 | Knorr et al. |
| 4,612,166 A | 9/1986 | Brock |
| 4,678,637 A | 7/1987 | Duerrschnabel et al. |
| 4,810,468 A | 3/1989 | Duerrschnabel et al. |
| 5,004,520 A | 4/1991 | Tsuji et al. |
| 5,024,814 A | 6/1991 | Futatasuka et al. |
| 5,032,358 A | 7/1991 | Helenius |
| 5,147,469 A | 9/1992 | Kanzaki et al. ............. 148/684 |

(List continued on next page.)

FOREIGN PATENT DOCUMENTS

| | | | |
|---|---|---|---|
| DE | 19600864 C2 | 2/2000 | |
| EP | 0784099 A2 | 7/1997 | ............. C22C/9/00 |
| EP | 1063309 A2 | 12/2000 | ............. C22C/9/00 |

(List continued on next page.)

OTHER PUBLICATIONS

"Standard Test Method for Bend Test for Formability of Copper Alloy Spring Material", ed. Feb. 1999, ASTM Designation: B 820–98, pp. 802–804.
"Standard Test Method for Semi–Guided Bend Test for Ductility of Metallic Materials", ed. Mar. 1992, ASTM Designation E 290–92, pp. 432–435.
"Quality Function Deployment from the perspective of Competitive Advantage" by Edwin B. Dean, from http://mijuno.larc.nasa.gov/dfc/qfd.html, (4 pages), 1994.

(List continued on next page.)

Primary Examiner—Sikyin Ip
(74) Attorney, Agent, or Firm—Wiggin and Dana LLP; Gregory S. Rosenblatt

(57) ABSTRACT

A copper alloy that consists essentially of, by weight, from 0.15% to 0.7% of chromium, from 0.005% to 0.3% of silver, from 0.01% to 0.15% of titanium, from 0.01% to 0.10% of silicon, up to 0.2% of iron, up to 0.5% of tin, and the balance copper and inevitable impurities has high strength, a yield strength in excess of 80 ksi, and high electrical conductivity, in excess of 80% IACS. The alloy further has substantially isotropic bend characteristics when the processing route includes a solution heat anneal above 850° C. and subsequent cold rolling into sheet, strip or foil interspersed by bell annealing. As a result, the alloy is particularly suited for forming into box-type electrical connectors for both automotive or multimedia applications. The alloy is also suitable for forming into a rod, wire or section.

15 Claims, 4 Drawing Sheets

U.S. PATENT DOCUMENTS

| | | | |
|---|---|---|---|
| 5,306,465 A | 4/1994 | Caron et al. | |
| 5,315,152 A | 5/1994 | Kuse et al. | 257/677 |
| 5,370,840 A | 12/1994 | Caron et al. | |
| 5,486,244 A | 1/1996 | Caron et al. | |
| 5,565,045 A | 10/1996 | Caron et al. | |
| 5,601,665 A | 2/1997 | Caron et al. | |
| 5,833,920 A | 11/1998 | Nakanishi et al. | |

FOREIGN PATENT DOCUMENTS

| | | | | |
|---|---|---|---|---|
| JP | 57051253 | | 3/1982 | |
| JP | 59193233 A | | 11/1984 | |
| JP | 59193233 | | 11/1984 | |
| JP | 60218440 | | 11/1985 | |
| JP | 61183426 | | 8/1986 | |
| JP | 62050426 | | 3/1987 | |
| JP | 62133050 A | | 6/1987 | |
| JP | 62182240 A | | 8/1987 | |
| JP | 62-202038 | | 9/1987 | |
| JP | 63-038561 | | 2/1988 | C22F/1/08 |
| JP | 63130739 | | 6/1988 | |
| JP | 63310930 | | 12/1988 | |
| JP | 64-028337 | | 1/1989 | C22C/9/06 |
| JP | 01198439 | | 8/1989 | |
| JP | 02163331 | * | 6/1990 | |
| JP | 02-163331 | | 6/1990 | |
| JP | 03072045 | * | 3/1991 | |
| JP | 03-072045 | | 3/1991 | |
| JP | 03188247 | | 8/1991 | |
| JP | 04221031 A | | 8/1992 | |
| JP | 04-221031 | | 8/1992 | |
| JP | 09025528 | | 1/1997 | |
| JP | 09-263864 | | 10/1997 | |
| JP | 11080863 | | 3/1999 | |
| JP | 11293367 | | 10/1999 | |
| JP | 11335800 | | 12/1999 | |
| JP | 2000063968 | * | 2/2000 | |
| JP | 2000073130 | | 3/2000 | |
| JP | 2000080428 | * | 3/2000 | |
| JP | 2000-080428 | | 3/2000 | |
| WO | WO00/29632 | | 5/2000 | |

OTHER PUBLICATIONS

"Comprehensive QFD from the Perspective of Competitive Advantage" by Edwin B. Dean, from http://mijuno.larc.nasa.gov/dfc/qfd.html, (4 pages), 1995.

*Silver–Bearing Copper*, Walter L. Finlay, Director of Research, Copper Range Company, NYC Corinthian Editions 1968, Chapter II pp. 7–9; Chapter III pp. 10–60; Chapter IV pp. 61–71.

*ASM Handbook*, vol. 2 Properties and Selection: Nonferrous Alloys and Special Purpose Materials, 1990, pp. 290–291.

* cited by examiner

SILVER CONTAINING COPPER ALLOY

CROSS REFERENCE TO RELATED PATENT APPLICATION

This patent application claims priority to U.S. Provisional Patent Application Ser. No. 60/224,054 that was filed on Aug. 9, 2000. The subject matter of that provisional patent application is incorporated by reference in its entirety herein.

BACKGROUND OF THE INVENTION

1. Field of the Invention

This invention relates to a silver containing copper alloy. More particularly, the inclusion of a controlled amount of silver in a copper alloy that further contains chromium, titanium and silicon results in improved resistance to stress relaxation and improved isotropic bend properties without a detrimental effect on either yield strength or electrical conductivity.

2. Description of Related Art

Copper alloys are formed into numerous products that take advantage of the high electrical conductivity and/or high thermal conductivity of the alloys. A partial list of such products includes electrical connectors, leadframes, wires, tubes, foils and powders that may be compacted into products. One type of electrical connector is a box-like structure formed by stamping a predefined shape from a copper alloy strip and then bending the stamped part to form the connector. It is necessary for the connector to have high strength and high electrical conductivity. In addition, the connector should have a minimal reduction in normal force as a function of time and temperature exposure, commonly referred to as resistance to stress relaxation.

Properties important for an electrical connector include yield strength, bend formability, resistance to stress relaxation, modulus of elasticity, ultimate tensile strength and electrical conductivity.

Target values for these properties and relative importance of the properties are dependent on the intended application of products manufactured from the subject copper alloys. The following property descriptions are generic for many intended applications, but the target values are specific for under the hood automotive applications.

The yield strength is the stress at which a material exhibits a specified deviation, typically an offset of 0.2%, from proportionality of stress and strain. This is indicative of the stress at which plastic deformation becomes dominant with respect to elastic deformation. It is desirable for copper alloys utilized as connectors to have a yield strength on the order of 80 ksi, that is approximately 550 MPa.

Stress relaxation becomes apparent when an external stress is applied to a metallic strip in service, such as when the strip is loaded after having been bent into a connector. The metal reacts by developing an equal and opposite internal stress. If the metal is held in a strained position, the internal stress will decrease as a function of both time and temperature. This phenomenon occurs because of the conversion of elastic strain in the metal to plastic, or permanent strain, by microplastic flow.

Copper based electrical connectors must maintain above a threshold contact force on a mating member for prolonged times for good electrical connection. Stress relaxation reduces the contact force to below the threshold leading to an open circuit. It is a target for a copper alloy for connector applications to maintain at least 90% of the initial stress when exposed to a temperature of 150° C. for 1000 hours and to maintain 85% of the initial stress when exposed to a temperature of 200° C. for 1000 hours.

The modulus of elasticity, also known as Young's modulus, is a measure of the rigidity or stiffness of a metal and is the ratio of stress to corresponding strain in the elastic region. Since the modulus of elasticity is a measure of the stiffness of a material, a high modulus, on the order of 150 GPa is desirable.

Bendability determines the minimum bend radius (MBR) which identifies how severe a bend may be formed in a metallic strip without fracture along an outside radius of the bend. The MBR is an important property for connectors where different shapes are to be formed with bends at various angles.

Bend formability may be expressed as, MBR/t, where t is the thickness of the metal strip. MBR/t is a ratio of the minimum radius of curvature of a mandrel about which the metallic strip can be bent without failure. The "mandrel" test is specified in ASTM (American Society for Testing and Materials) designation E290-92, entitled *Standard Test Method for Semi-Guided Bend Test for Ductility of Metallic Materials*, and is incorporated by reference in its entirety herein.

It is desirable for the MBR/t to be substantially isotropic, a similar value in the "good way", bend axis perpendicular to the rolling direction of the metallic strip, as well as the "bad way", bend axis parallel to the rolling direction of the metallic strip. It is desirable for the MBR/t to be about 0.5 or less for a 90° bend and about 1 or less for a 180° bend.

Alternatively, the bend formability for a 90° bend may be evaluated utilizing a block having a V-shaped recess and a punch with a working surface having a desired radius. In the "V-block" method, a strip of the copper alloy in the temper to be tested is disposed between the block and the punch and when the punch is driven down into the recess, the desired bend is formed in the strip.

Related to the V-block method is the 180° "form punch" method in which a punch with a cylindrical working surface is used to shape a strip of copper alloy into a 180° bend.

Both the V-block method and the form punch method are specified in ASTM designation B820-98, entitled *Standard Test Method for Bend Test for Formability of Copper Alloy Spring Material*, that is incorporated by reference in its entirety herein.

For a given metal sample, both methods give quantifiable bendability results and either method may be utilized to determine relative bendability.

The ultimate tensile strength is a ratio of the maximum load a strip withstands until failure during a tensile test expressed as a ratio of the maximum load to the cross-sectional area of the strip. It is desirable for the ultimate tensile strength to be about 85–90 ksi, that is approximately 585–620 MPa.

Electrical conductivity is expressed in % IACS (International Annealed Copper Standard) in which unalloyed copper is defined as having an electrical conductivity of 100% IACS at 20° C. It is desirable for copper alloys for high performance electrical connectors to have an electrical conductivity of at least 75% IACS. More preferably, the electrical conductivity is 80% IACS or higher.

One copper alloy that approaches the desired properties is designated by the Copper Development Association, New York, N.Y., as C18600. C18600 is an iron containing copper-chromium-zirconium alloy and is disclosed in U.S. Pat. No. 5,370,840 to Caron, et al that is incorporated by reference in its entirety herein. C18600 has a nominal composition by weight of 0.3% chromium, 0.2% zirconium, 0.5% iron, 0.2% titanium and the balance copper and inevitable impurities.

Throughout this patent application, all percentages are expressed as weight percent unless otherwise noted.

Mechanical and electrical properties of copper alloys are highly dependent on processing. If C18600 is subjected to an aging anneal, a 33% cold roll and a relief anneal, the alloy achieves as nominal properties: an electrical conductivity of 73% IACS; a yield strength of 90 ksi; a 90° MBR/t of 1.2 in the good way and 3.5 in the bad way utilizing the mandrel method("roller bend" method); and a 20% loss in stress when subjected to 200° C. for 1000 hours.

U.S. Pat. No. 4,678,637 to Duerrschnabel et al discloses a copper alloy containing additions of chromium, titanium and silicon and is incorporated by reference in its entirety herein. This alloy, designated by the CDA as C18070, has a nominal composition of 0.28% chromium, 0.06% titanium, 0.04% silicon and the balance copper and unavoidable impurities. When processed by hot rolling, quench and cold rolling interspersed with one or two intermediate bell anneals, the alloy achieves as nominal properties: an electrical conductivity of 86% IACS; a yield strength of 72 ksi (496 MPa), a 90% MBR of 1.6t in the good way and 2.6t in the bad way; and a loss of 32% of the stress when subjected to 200° C. for 1000 hours.

DE 196 00 864 C2 by Wieland-Werke AG, discloses an alloy containing 0.1%–0.5% chromium, 0.01%–0.25% titanium, 0.01%–0.1% silicon, 0.02%–0.8% magnesium with the balance being copper and inevitable impurities. The magnesium addition is disclosed as improving the resistance of the alloy to stress relaxation.

A small addition of silver, on the order of up to 25 troy ounces per ton avoirdupois (.085 weight percent), enables cold worked copper to maintain its strength at temperatures of up to about 400° C. as disclosed in *Silver-Bearing Copper* by Finlay, 1968. One silver-containing copper alloy is designated by the CDA as copper alloy C15500. C15500 contains 0.027–0.10% silver, 0.04–0.08% phosphorous, 0.08–0.13% magnesium and the balance is copper and unavoidable impurities. The alloy is reported in the *ASM Handbook* as having an electrical conductivity of 90% IACS in an annealed condition, a yield strength of 72 ksi (496 MPa) in the spring temper. Bend formability and resistance to stress relaxation are not reported.

While the copper alloys described above achieve some of the desired properties for connectors, there remains a need for an improved copper alloy that comes closer to the target requirements and further, there remains a need to characterize a copper alloy utilizing a holistic system that integrates multiple customer identified desired properties into a single performance indicator.

SUMMARY OF THE INVENTION

Accordingly, it is an object of the invention to provide a copper base alloy that is particularly suited for electrical connector applications. It is a feature of the invention that this copper base alloy contains chromium, titanium and silver. Yet another feature of the invention is that iron and tin may be added to promote grain refinement and increase strength. Still another feature of the invention is to maximize desired electrical and mechanical properties by processing of the alloy including the steps of solution anneal, quench, cold roll and age. Still a further feature of the invention is that a holistic approach to alloy properties is utilized to integrate multiple alloy properties by way of factors weighted by customer derived rankings for specific connector applications.

It is an advantage of the invention that the alloy of the invention may be processed to have a yield strength in excess of 80 ksi (550 MPa) and an electrical conductivity in excess of 80% IACS making the alloy particularly useful for forming into electrical connectors for both automotive and multimedia applications. Among the advantageous properties of the alloy of the invention are an enhanced resistance to stress relaxation at elevated temperatures of up to 200° C. A still further advantage is that a strip of metal formed from the alloy has substantially isotropic bend formability and excellent stampability making it particularly useful for forming into box-type connectors.

In accordance with the invention, there is provided a copper alloy that consists essentially of, by weight, from 0.15% to 0.7% of chromium, from 0.005% to 0.3% of silver, from 0.01% to 0.15% of titanium, from 0.01% to 0.10% of silicon, up to 0.2% of iron, up to 0.5% of tin, and the balance is copper and inevitable impurities.

In accordance with the invention there is provided a process for forming a copper alloy having high electrical conductivity, good resistance to stress relaxation and isotropic bend properties. This process includes the steps of casting a copper alloy that contains, by weight, from 0.15% to 0.7% of chromium, additional desired alloying additions, and the balance is copper and inevitable impurities. This copper alloy is formed into a strip that is solution annealed, by a strip anneal process, at a temperature of from 850° C. to 1030° C. for from 5 seconds to 10 minutes. A preferred strip anneal time is from 10 seconds to 5 minutes. The strip is then quenched from a temperature of at least 850° C. to a temperature of less than 500° C. in at most 10 seconds. The quenched strip is then cold rolled to a reduction of from 40% to 99% in thickness and then annealed at a temperature of between 350° C. and 550° C. for from one hour to 10 hours.

The above stated objects, features and advantages will become more apparent from the specification and drawings that follow.

IN THE DRAWINGS

Figure 3:
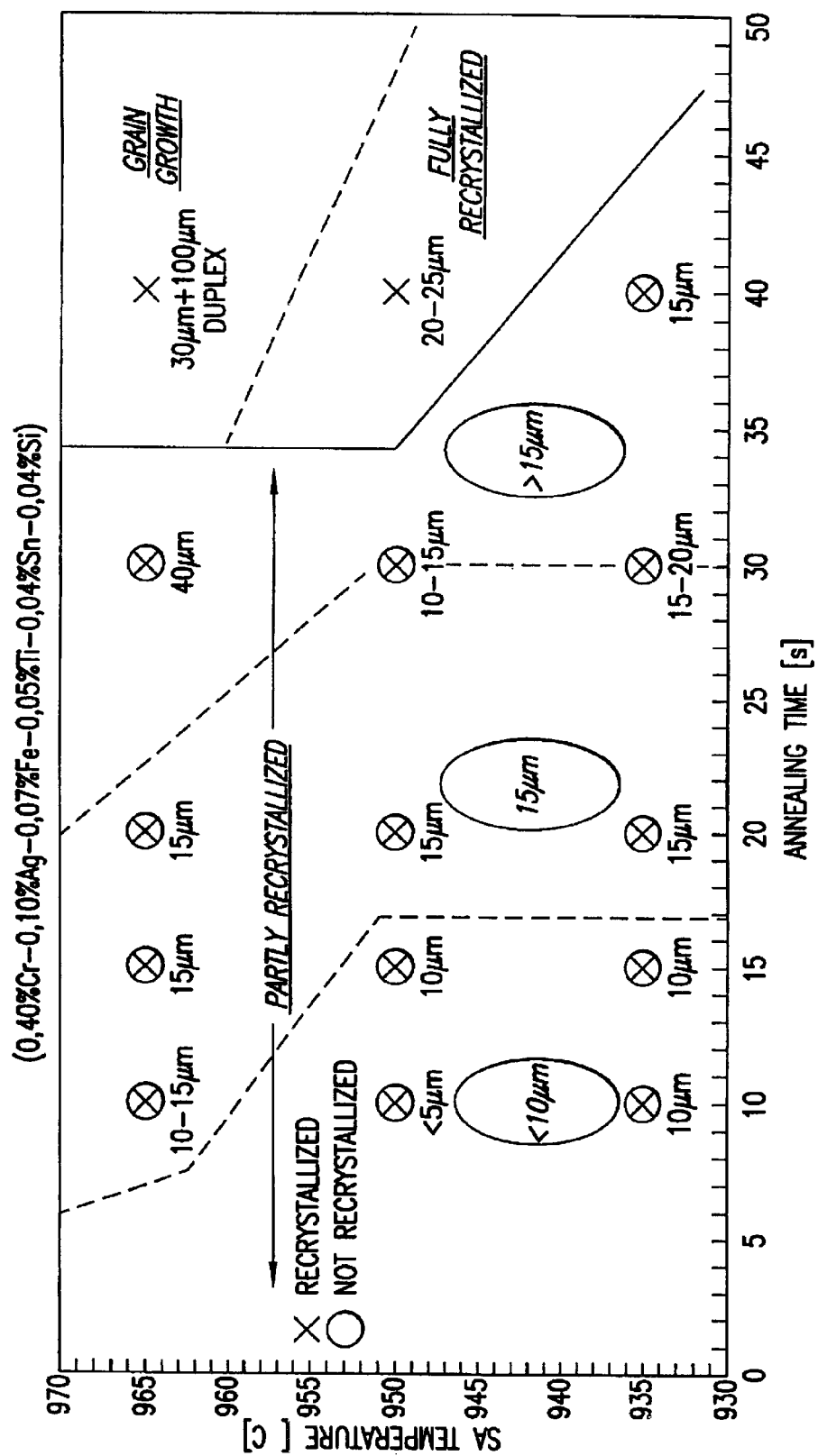

FIG. 3 graphically illustrates recrystallized grain size for an alloy of the invention having 0.40 weight percent of chromium as a function of solution annealing temperature and solution annealing time.

Figure 4:
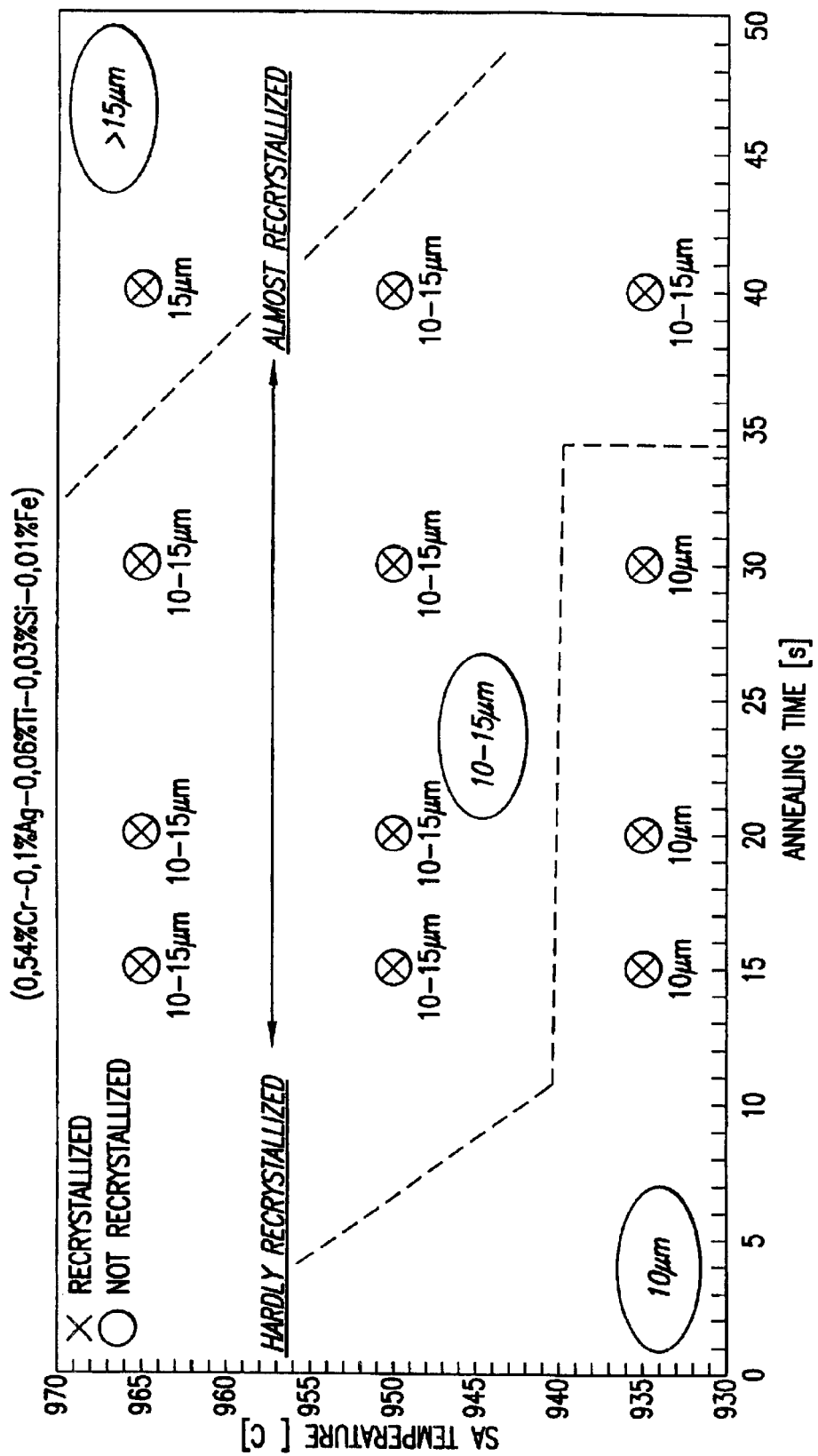

FIG. 4 graphically illustrates recrystallized grain size for an alloy of the invention having 0.54 weight percent of chromium as a function of solution annealing temperature and solution annealing time.

DETAILED DESCRIPTION

The alloy of the invention is particularly suited for under the hood automotive applications where it may be subject to elevated ambient temperatures as well as relatively high electrical currents generating $I^2R$ heating. In addition, the alloy is useful for multimedia applications, such as computers or telephones, where the service temperature is lower, typically on the order of 100° C. maximum, and signals of relatively low electrical currents are carried.

The alloy of the invention consists essentially of:
from 0.15% to 0.7% chromium,
from 0.005% to 0.3% silver,
from 0.01% to 0.15% titanium,
from 0.01% to 0.10% silicon,
up to 0.2% iron,
up to 0.5% tin, and
the balance is copper and inevitable impurities.
A more preferred alloy range is:
from 0.25%–0.60% chromium,
from 0.015%–0.2% silver,
from 0.01%–0.10% titanium,
from 0.01%–0.10% silicon,
less than 0.1% iron,
up to 0.25% tin, and
the balance is copper and inevitable impurities.
A most preferred alloy composition is:
from 0.3%–0.55% chromium,
from 0.08%–0.13% silver,
from 0.02%–0.065% titanium,
from 0.02%–0.08% silicon,
0.03%–0.09% iron,
less than 0.05% tin, and
the balance is copper and inevitable impurities.

If high strength is of particularly high relative importance, then the titanium content should be 0.05% or higher. If high electrical conductivity is of particularly high relative importance, then the titanium content should be 0.065% or less.

Chromium—Chromium particles precipitate during aging anneals thereby providing age-hardening and a concomitant conductivity increase. It is also believed that the chromium precipitate stabilizes the alloy microstructure by retarding grain growth through second phase pinning of grain boundaries. A minimum of 0.15%, by weight, of chromium is required to achieve these beneficial results.

When the chromium content exceeds 0.7%, the maximum solid solubility limit of chromium in the copper alloy is approached and a coarse second phase precipitate develops. The coarse precipitate detrimentally affects both the surface quality and plating characteristics of the copper alloy without a further increase in the strength of the alloy. It is further believed that an excess of chromium detrimentally impacts recrystallization.

Silver—Silver promotes isotropic bend properties thereby improving the utility of the alloy for electrical connector applications. In addition, silver increases strength, particularly when the chromium content is at the low end, 0.3% or less, of the specified ranges. When the alloy is in the aged condition, the silver addition improves resistance to elevated temperature stress relaxation.

When the silver content is less than 0.005%, the beneficial effects are not fully realized. When the silver content exceeds 0.3%, the increased cost due to the presence of silver outweighs the benefits of its inclusion.

Titanium—Titanium enhances stress relaxation resistance and increases the alloy strength. Below 0.01% titanium, these beneficial effects are not achieved. Excess titanium has a detrimental effect on electrical conductivity of the alloy, probably more so than any of the other alloying elements. To achieve an electrical conductivity of at least 80% IACS, the titanium content should be maintained at 0.065% or less. To achieve a high strength, the titanium content should be maintained at 0.05% or more.

Silicon—Silicon enhances stress relaxation resistance and alloy strength. When the silicon content is less than 0.01%, the beneficial effect is not achieved. When the silicon content exceeds 0.1%, a loss in electrical conductivity outweighs any gain in stress relaxation resistance.

Iron—Iron is an optional addition that increases the strength of the alloy and also enhances grain refinement, in both the as-cast and as-processed condition. The grain refinement improves bend formability. However, an excess of iron unduly decreases electrical conductivity. An electrical conductivity of 80% IACS is a desirable consideration, and therefore the iron should be restricted to below 0.1% in accordance with the most preferred alloy composition.

When present, the iron to titanium ratio, by weight, is preferably between 0.7:1 and 2.5:1, and more preferably between 0.9:1 and 1.7:1 and most preferably about 1.3:1. For some embodiments, the iron to titanium ratio, by weight, is preferably between 0.9:1 and 1.1:1 and mostmore preferably about 1:1.

Tin—Tin is an optional addition that increases the strength of the alloy, but if present in an excessive amount reduces electrical conductivity and also appears to promote stress relaxation. Accordingly, there should be less than 0.5% by weight tin present in the alloy and preferably less than 0.05% tin in the alloy when an electrical conductivity of 80% IACS is required.

Other additions—Other elements may be present in the alloy of the invention to achieve desired property enhancements without significantly reducing desirable properties such as bend formability, resistance to stress relaxation or electrical conductivity. The total content of these other elements is, for the most part, less than 1% and preferably less 0.5%. Exceptions to this generality are recited below.

Cobalt may be added as a 1:1, by weight, substitute for iron.

Magnesium may be added to improve solderability and solder adhesion. Magnesium is also effective to enhance cleaning of the alloy surface during processing. A preferred magnesium content is from about 0.05% to about 0.2%. Magnesium may also improve the stress relaxation characteristics of the alloy.

Machinability, without a significant decrease in electrical conductivity, can be enhanced by additions of sulfur, selenium, tellurium, lead or bismuth. These machinability enhancing additions form a separate phase within the alloy and do not reduce electrical conductivity. Preferred contents are up to 3% for lead, from about 0.2% to about 0.5% for sulfur and from about 0.4% to 0.7% for tellurium.

De-oxidizers can be added in preferred amounts of from about 0.001% to about 0.1%. Suitable de-oxidizers include boron, lithium, beryllium, calcium and rare earth metals either individually or as mischmetal. Boron, that forms borides, is beneficial as it also increases the alloy strength. Magnesium, recited hereinabove, is also effective as a deoxidizer.

Additions which increase strength, with a reduction in electrical conductivity, including aluminum and nickel, should be present in amounts of less than 0.1%.

Zirconium has a propensity to combine with silicon and form coarse particles of zirconium silicide. Therefore, it is preferred that the alloy be essentially zirconium free, that is zirconium in impurity amounts only.

Figure 1:
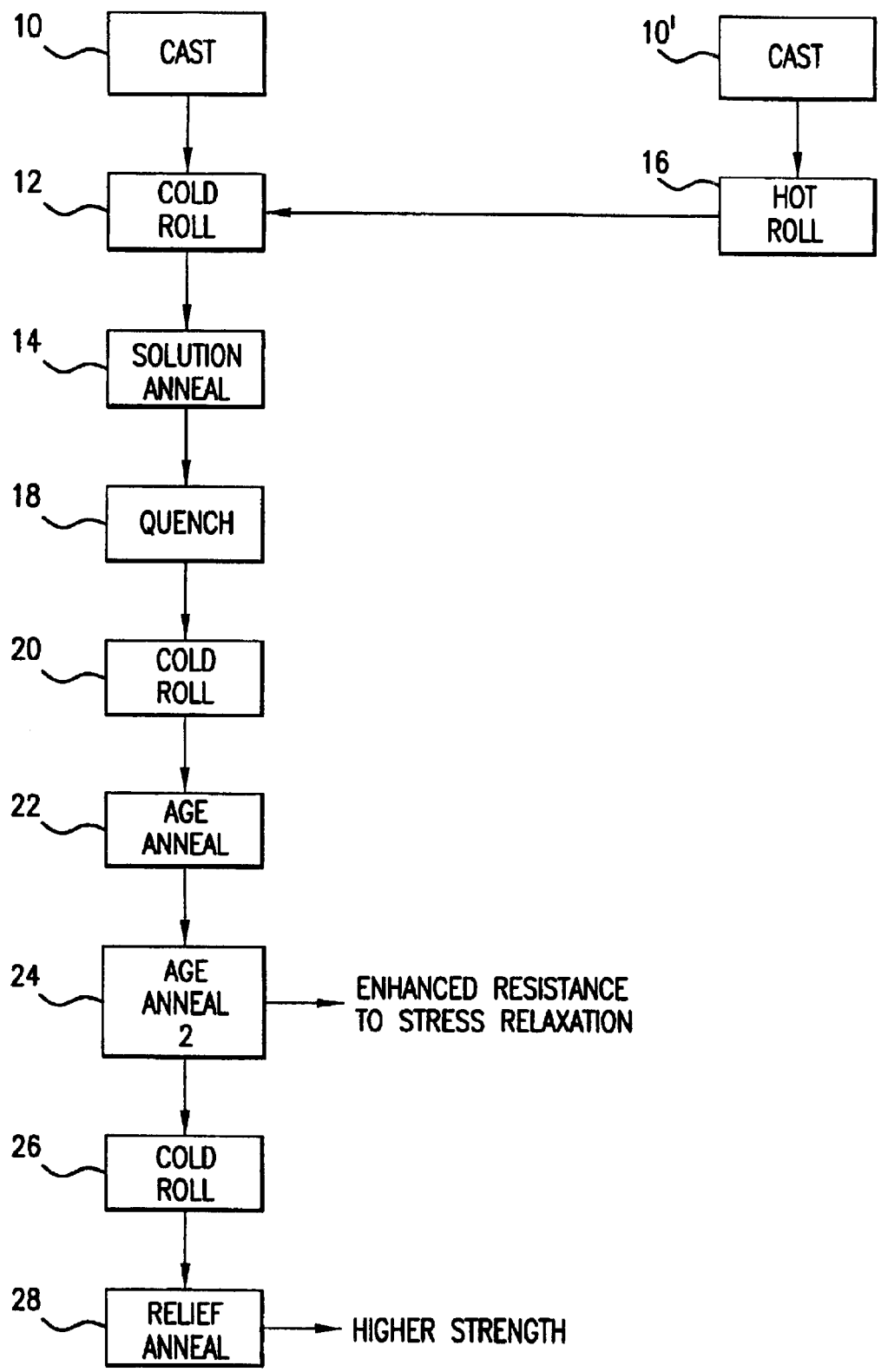
FIG. 1 is a flow chart of processing steps for the manufacture of strip from the copper alloy of the invention.

The processing of the alloy of the invention has a significant impact on the finished gauge alloy properties. FIG. 1 illustrates in block diagram a sequence of processing steps to achieve the yield strength, bend formability, resistance to stress relaxation, modulus of elasticity, ultimate tensile strength and electrical conductivity desired for the subject copper alloy. These processing steps are believed beneficial for any chromium containing copper alloy.

The alloy is initially cast 10 by any suitable process. For example, cathode copper may be melted at a temperature of approximately 1200° C. in a crucible or a melt furnace with a charcoal cover. Chromium, and as desired, the other alloying elements of titanium, silicon, silver and iron are then added to the melt in the form of appropriate master alloys for a casting of a desired composition. The casting may be via a continuous process, such as strip casting or belt casting, in which the casting leaves the strip or belt at a thickness suitable for cold rolling 12 prior to solution annealing 14. This casting thickness is preferably from about 0.4 inch to 1 inch and it is then cold rolled to a nominal thickness of about 0.045 inch.

Alternatively, the alloy may be cast 10' as a rectangular ingot and broken down into strip by hot rolling 16. Typically, hot rolling will be at a temperature of between 750° C. and 1030° C. and used to reduce the thickness of the ingot to somewhat above the solution anneal thickness. Hot rolling may be in multiple passes and generally used to form a strip having a thickness greater than that desired for solution annealing.

While processing is described in terms of a copper alloy strip with working by hot and cold rolling, the copper alloys of the invention may also be formed into rods, wires or tubes in which instance, the working would more likely be in the form of drawing or extrusion.

Following hot rolling 16, the strip is water quenched and then trimmed and milled to remove any oxide coatings. The strip is then cold rolled 12 to solution anneal 14 gauge. Cold rolling 12 may be in a single pass or multiple passes with intermediate anneals if necessary. An intermediate anneal at a temperature of from about 400° C. to 550° C. for from about four hours to eight hours yielded, at the end of the process, a higher strength alloy with fine grains, on the order of 10 microns, and a homogenous structure. If the intermediate anneal temperature approaches full homogenization, the alloy at the end of the process has lower strength and coarse grain stringers. Omitting the intermediate anneal results in an alloy at the end of processing with a grain size in the 25 micron to 30 micron range. To enhance the recrystallized grain structure, it is preferred that the cold rolling step impart the strip with a degree of cold work, such as a 25%–90% reduction in thickness.

The alloy is solution annealed 14 at a time and temperature effective to achieve full recrystallization without excessive grain growth. Preferably, the maximum grain size is maintained at 20 microns or less. More preferably, the maximum grain size is 15 microns or less. The annealing time and temperature should further be selected to be effective to achieve microstructural homogeneity. Thus, if the annealing time or temperature is too low, hardness and microstructural deviations from one portion of the strip to the other are obtained leading to non-isotropic bend properties. Excessive annealing time or temperature leads to undue grain growth and poor bend formability. As a broad range, the solution anneal 14 should be a strip anneal at a temperature of from 850° C. to 1030° C. for from 10 seconds to 15 minutes. More preferably, the solution anneal 14 is at a temperature of from 900° C. to 1000° C. for from 15 seconds to ten minutes and most preferably from 930° C. to 980° C. for from 20 seconds to five minutes.

FIG. 3 graphically illustrates the effect of solution annealing (SA) time and temperature on the recrystallization and grain growth for a copper alloy having 0.40% chromium. The reported values, such as 10–15 $\mu$m, are grain size. At a temperature of 950° C., recrystallization without undue grain growth is achieved at an annealing time of from about 17 seconds to about 35 seconds. At less than 17 seconds there is limited recrystallization. In excess of 35 seconds, the alloy is fully recrystallized but grain sizes of between 20 and 25 microns are formed and when the time exceeds about 40 seconds, rapid grain growth with grains in the 30 micron up to 100 micron range are obtained.

FIG. 4 graphically illustrates the effect of solution annealing time to temperature when the alloy contains 0.54% chromium and demonstrates how increasing the chromium content broadens the acceptable range of annealing time and temperature. Recrystallization with a grain size of 10 to 15 microns is achievable in this instance at 950° C. with times of from about 7 seconds up to about 45 seconds. However, while grain size is very well controlled, undissolved chromium particles become larger degrading alloy properties.

Referring back to FIG. 1, the solution annealed 14 alloy is next quenched 18 to retain microstructural homogeneity. Quenching should take the alloy temperature from the solution anneal temperature, minimum 850° C. and preferably in excess of 900° C., to below 500° C. in 20 seconds or less. More preferably, the quench rate is from 900° C. to less than 500° C. in 10 seconds or less.

While multiple solutionization anneals 14 effective for recrystallization may be utilized, it is preferred that there is a single solution anneal effective for recrystallization.

Following quenching 18, the alloy is cold rolled 20 to a 40% to 80%, by thickness, reduction for strip or sheet. For foil, a cold roll reduction in excess of 90%, or preferably up to 99%, in thickness, is preferred. Preferably, the strip or sheet cold rolled reduction is from 50% to 70%, by thickness, and effected with one or more passes through the rolling mill to generate a heavily cold worked strip.

The alloy is next given an aging heat treatment 22. The aging heat treatment 22 may be in one step, or preferably is in two steps. It has been found that step aging results in higher strength and electrical conductivity and it is believed that bend formability may also be improved by the step aging. The first aging step, and only aging step if done in a single step, is at a temperature of from about 350° C. to about 550° C. for from one to ten hours. Preferably, this first aging step 22 is at a temperature of from 400° C. to 500° C. for from one to three hours.

If the age anneal is done in multiple steps, the second step anneal 24 is at a temperature of from about 300° C. to about 450° C. for from one to twenty hours leading to increased electrical conductivity without a loss in strength. Preferably, the second step aging 24 is at a temperature of from about 350° C. to about 420° C. for from five to seven hours.

The alloy may be used in the age annealed condition when enhanced resistance to stress relaxation is required, for example, in automotive applications. Following the aging anneal, the alloy has a yield strength of about 68 ksi (470 MPa) and an electrical conductivity of about 80% IACS. If still higher strengths are required, additional processing steps may follow the age anneal step 22 or 24.

The age annealed copper alloy strip is cold rolled 26 to a final gauge thickness, typically on the order of 0.25 mm to 0.35 mm, although it is a target for future connectors to have a thickness on the order of 0.15 mm (0.006 inch) or less. The thin strip material, under about 0.006 inch, is also useful as a copper alloy foil product. Generally, the cold rolling 26 will be in one or more passes through a rolling mill with a reduction of between 10% and 50%, in thickness.

Following cold roll 26, there may be a stress relief anneal 28 at a temperature of between 200° C. and 500° C. for from 10 seconds to 10 hours. Preferably, the stress relief anneal 28 is at a temperature of between 250° C. and 350° C. for from 1 hour to 3 hours.

Figure 2:
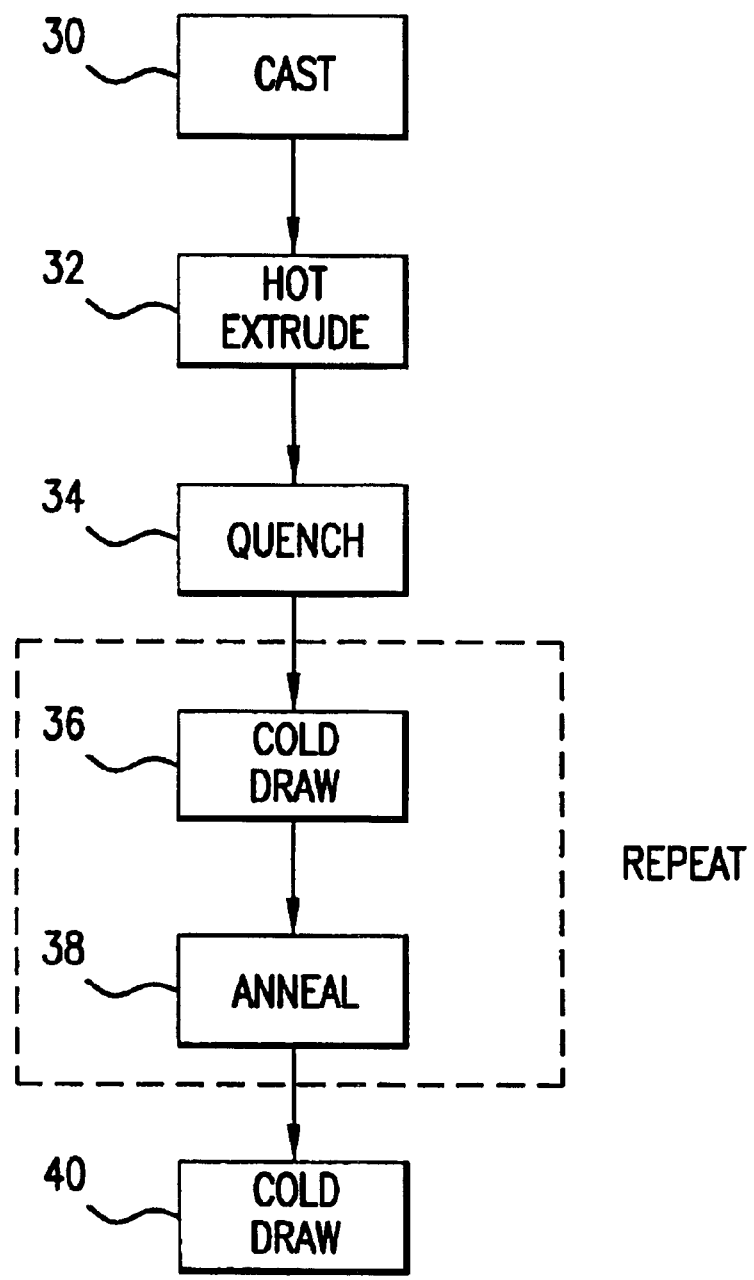
FIG. 2 is a flow chart of processing steps for the manufacture of wire or rod from the copper alloy of the invention.

FIG. 2 illustrates in block diagram a process flow particularly suited for the manufacture of wire and rod. The copper alloy of the invention is cast 30 by any suitable process and extruded 32 to form a rod with a desired cross-sectional shape, preferably the cross-sectional shape is circular. The hot extrusion is at a temperature of between 700° C. and 1030° C. and preferably at a temperature of between 930° C. and 1020° C.

The extruded rod is quenched 34 and then cold drawn (or cold extruded) 36 to a reduction in diameter of up to 98%. The drawn rod is then annealed 38 at a temperature of from 350° C. to 900° C. for from 1 minute up to 6 hours. The sequence of cold draw 36 and anneal 38 may be repeated one or more additional times and then cold drawn (or cold extruded) 40 to final gauge.

While individual properties such as yield strength, resistance to stress relaxation and electrical conductivity are individually important to characterizing a copper alloy suitable for use as an electrical connector, a holistic value integrating multiple relevant properties is more useful. This holistic approach may utilize Quality Function Deployment, QFD. QFD is a methodology for developing a design quality aimed at satisfying the customer and then translating the customer's demand into design targets to be used throughout the production phase. The customer is surveyed to identify those properties most important to the customer's application and to rank the relative importance of each of those properties. The customer also identifies a range of values for each of the desired properties from a "disappointing" minimally acceptable value to "desirable" up to "exaggerated". QFD is more fully described in two articles by Edwin B. Dean, *Quality Function Deployment from the Perspective of Competitive Advantage,* 1994 and *Comprehensive QFD from the Perspective of Competitive Advantage,* 1995. Both articles are downloadable at http://mijuno.larc.nasa.gov/dfc/qfd/cqfd.html and incorporated by reference in their entireties herein.

Table 1 recites a list of properties, ratings and ranges for a copper alloy intended for use in automotive applications while Table 2 recites similar properties, ratings and ranges for a copper alloy for use in a multimedia application. The "rating" is on a scale of 1 to 10 with 10 meaning the property value is of utmost value while 1 meaning the property value of minimal value.

TABLE 1

AUTOMOTIVE AND INDUSTRIAL CONNECTOR

| Properties | Relative Importance | Disappointing $E_u$ (5) | Desirable $E_i$ (50) | Exaggerated $E_o$ (95) |
|---|---|---|---|---|
| Yield Strength | 1.0 | 300 MPa | 550 MPa | 800 MPa |
| Stress Relaxation | .82 | | | |
| 150°/1000 h | .55 | 30% | 10% | 5% |
| 200°/1000 h | .27 | 40% | 15% | |
| Modulus of Elasticity | .66 | 100 GPa | 150 GPa | 200 GPa |
| Bendability | .65 | | | |
| 90°-Bend | .325 | 1 × t | 0.5 × t | 0 × t with coining prior to pending |
| 180°-Bend | .325 | 2 × t | 1 × t | 0 × t |
| Ultimate Tensile Strength | .59 | 420 MPa | 680 MPa | 950 MPa |

TABLE 1-continued

AUTOMOTIVE AND INDUSTRIAL CONNECTOR

| Properties | Relative Importance | Disappointing $E_u$ (5) | Desirable $E_i$ (50) | Exaggerated $E_o$ (95) |
|---|---|---|---|---|
| Conductivity | .46 | 40% IACS | 75% IACS | 90% IACS |
| Tolerance of Yield Strength | .46 | 140 MPa | 50 MPa | 30 MPa |

Stress relaxation has an overall relative importance of .82. The 150° C. value is twice as important to customers as the 200° C. value so that the relative importance of 150° C. stress relaxation is (.82 × .67 = .55) and 200° C. stress relaxation is (.82 × .33 = .27)
90° bend and 180° bend of equal relative importance, both (.65 × .5 = .325).
90° bend value utilizing V-block method, 180° bend value utilizing forming punch method.

TABLE 2

MULTIMEDIA CONNECTORS

| Properties | Relative Importance | Disappointing $E_u$ (5) | Desirable $E_i$ (50) | Exaggerated $E_o$ (95) |
|---|---|---|---|---|
| Yield Strength | 1.0 | 400 MPa | 600 MPa | 800 MPa |
| Modulus of Elasticity | .8 | 90 GPa | 130 GPa | 180 GPa |
| Bendability | .65 | | | |
| 90°-Bend | .325 | 4 × t | 1 × t | 0 × t |
| 180°-Bend | .325 | 5 × t | 2 × t | 0 × t |
| Ultimate Tensile Strength | .6 | 500 MPa | 700 MPa | 950 MPa |
| Stress Relaxation 100° C./1000 h | .5 | 40% | 15% | 5% |
| Conductivity | .4 | 3% IACS | 30% IACS | 60% IACS |
| Tolerance of Yield Strength | .3 | 140 MPa | 60 MPa | 30 MPa |

90° bend and 180° bend of equal relative importance, both (.65 × .5 = .325).
90° bend value utilizing V-block method, 180° bend value utilizing forming punch method.

The copper alloys of the invention are capable of achieving a QFD value in excess of 50 (desirable) both for automotive and industrial applications and for multimedia applications indicating that a customer would find the subject copper alloy acceptable for both applications.

While described above in terms of copper alloy strip formed into electrical connectors, the alloy and processing of the invention are equally suitable for forming into leadframes. Leadframes require good bend properties as the outer leads are bent at a 90° angle for insertion into a printed circuit board. The fine grain structure and absence of coarse particles makes the alloy amenable to uniform chemical etching, a process used in leadframe formation.

While described above in terms of a copper alloy formed into a strip, the alloy and processing of the invention are equally suitable for forming rod, wire and sections for electrical applications. Prerequisite high stiffness is provided by the high Young's Modulus, around 140 GPa, of the alloy. Higher electrical conductivity and higher strength may be achieved, at the expense of bendability, by extending intermediate rolling or drawing to up to 98%, by thickness, and by adding one or more intermediate anneals at a temperature of from 350° C. to 900° C. for from 1 minute to 6 hours.

The advantages of the copper alloy of the invention will become more apparent from the examples that follow.

EXAMPLES

Example 1

A copper alloy having a nominal composition of 0.55% chromium, 0.10% silver, 0.09% iron, 0.06% titanium, 0.03% silicon, 0.03% tin and the balance copper and inevitable impurities was melted and cast into an ingot. The ingot was machined and hot rolled at 980° C., quenched and processed to a strip thickness of 1.1 mm. The strip was cut into a piece of about 300 mm in length, immersed into a molten salt bath at 950° C. for 20 seconds, and then quenched in water to room temperature (nominally 20° C.). The surfaces of the cut strip were milled to remove surface oxides and then cold rolled to an intermediate gauge of 0.45 mm and heat treated at 470° C. for 1 hour followed by heat treating at 390° C. for 6 hours. After that, the strip material was rolled to a final gauge of 0.3 mm and subjected to a stress relief anneal at 280° C. for two hours.

The final product showed the following properties:

Yield strength=84 ksi (580 MPa);

Modulus of elasticity=145 GPa;

90° bending radius 0×t (V-block method, micrographic inspection revealed no cracks);

180° bending radii 0.8×t (form punch method micrographic inspection revealed no cracks);

Stress relaxation
  6% loss of stress following 100° C. exposure for 1000 hours,
  13% drop in stress following exposure to 150° C. for 1000 hours, and
  22% loss of stress following 200° C. exposure for 1000 hours;

Ultimate tensile strength 86 ksi (593 MPa); and

Electrical conductivity 79% IACS.

This alloy had a QFD rating for automotive and industrial applications of 54, see Table 12 and for multimedia applications 64, see Table 11.

Example 2

Seven copper alloys having the compositions identified in Table 3 were melted and cast as 10 pound ingots into steel molds. After gating, the ingots had a size of 4"×4"×1.75". The cast ingots were heat-soaked at 950° C. for two hours and then hot rolled in six passes to a thickness of 0.50" and water quenched. Following trimming and milling to remove oxide coating, the alloys were cold rolled to a nominal thickness of 0.045" and solution heat-treated at 950° C. for 20 seconds in a fluidized bed furnace followed by a water quench.

The alloys were then cold rolled to a 60% reduction, by thickness, in a sequence of several passes to a thickness of 0.018" and then subjected to a double aging anneal consisting of a first static anneal at 470° C. for one hour followed by a second static anneal at 390° C. for six hours. This heat treatment hardened the alloys while increasing conductivity over the cold rolled values without recrystallizing the microstructure. The alloys were then cold rolled for a 33% reduction in thickness to 0.012" and given a relief anneal heat treatment of 280° C. for two hours. As shown in Table 4, the nominal commercially favorable combination of 80 ksi yield strength and 80% IACS electrical conductivity was approached with the alloys of the invention.

TABLE 3

|      | Cr   | Ti    | Si    | Ag    | Fe   | Sn   |
|------|------|-------|-------|-------|------|------|
| J306 | 0.32 | 0.060 | 0.020 | X     | X    | X    |
| J308 | 0.50 | 0.048 | 0.020 | 0.046 | X    | X    |
| J310 | 0.53 | 0.057 | 0.015 | 0.10  | X    | X    |
| O    | 0.3  | 0.06  | 0.03  | 0.1   | X    | X    |
| E    | 0.3  | 0.06  | 0.03  | X     | X    | X    |
| BT   | 0.50 | 0.06  | 0.03  | 0.1   | 0.06 | 0.10 |
| BU   | 0.50 | 0.06  | 0.03  | X     | 0.06 | 0.10 |
| K005 | 0.30 | 0.06  | 0.03  | X     | X    | X    |
| K007 | 0.40 | 0.05  | 0.04  | 0.10  | 0.07 | 0.04 |
| K008 | 0.54 | 0.06  | 0.03  | 0.1   | 0.01 | X    |

X = Present in impurity levels only

TABLE 4

| Alloy | Condition | YS Ksi | UTS Ksi | Elong. % | Conductivity % IACS |
|-------|-----------|--------|---------|----------|---------------------|
| J308  | Cold Roll | 62     | 64      | 2        | 44.7                |
|       | Aged      | 72     | 76      | 9        | 84.3                |
|       | Relief Anneal | 79 | 81      | 2        | 83.2                |
| J310  | Cold Roll | 62     | 64      | 2        | 41.8                |
|       | Aged      | 72     | 76      | 8        | 79.7                |
|       | Relief Anneal | 81 | 82      | 3        | 77.3                |

Alloys O and E were processed essentially the same way as alloys J308 and J310 except that the hot rolling began after a 1000° C. for 12 hour homogenization anneal, the solution heat treatment was 900° C. for 90 seconds in a salt bath followed by a water quench and the aging treatment was 500° C. for one hour. The tensile and conductivity properties were obtained in the as-aged condition at both 0.2 mm gauge (Process A) and at 0.3 mm gauge (Process B) and shows (Table 5) the increase in strength provided by the silver addition at a 0.3% chromium level.

TABLE 5

| Alloy | Process | YS Ksi | UTS Ksi | Elong. % | Conductivity % IACS |
|-------|---------|--------|---------|----------|---------------------|
| O     | A       | 67.6   | 72.1    | 12       | 78.6                |
| E     | A       | 63.2   | 68.3    | 8        | 80.3                |
| O     | B       | 66.7   | 71.5    | 11       | 78.1                |
| E     | B       | 64.4   | 69.3    | 12       | 80.3                |

Alloys BT and BU were processed essentially the same way as alloys O and E except that the aging treatment consisted of two-stage anneal with a first stage of 470° C. for one hour and a second stage of 390° C. for six hours. The tensile strength and conductivity properties were measured in the as-aged condition and, as shown in Table 6, showed a decrease in stress relaxation (increase in stress relaxation resistance) with a silver addition at a 0.5% chromium level.

TABLE 6

| Alloy | YS Ksi | UTS Ksi | Elong. % | Conductivity % IACS | Amount (%) of Stress Relaxation at 1000 hours 100° C. | 150° C. | 200° C. |
|-------|--------|---------|----------|---------------------|-------------------------------------------------------|---------|---------|
| BT    | 70.1   | 74.8    | 9        | 79.1                | 2.4                                                   | 4.8     | 10.9    |
| BU    | 70.2   | 74.8    | 11       | 80.0                | 3.9                                                   | 7.3     | 11.7    |

Example 3

Tables 7A and 7B show how both the composition and processing of the invention lead to improved bends. As shown in Table 7A, when processed with a solution heat treatment (SHT) the alloy of the invention J310 had isotropic bends while the silver-free control alloy J306 had somewhat anisotropic bends. Control alloy K005 when processed with bell anneals (BA) with intervening cold rolling reductions, had anisotropic and poorer bends. Bend evaluation of alloys J306, J310 and K005 in Table 7A was by the mandrel method which has been found to give at least 0.5 higher bend values than by the V-block method. When alloys K007 and K005 were processed by the steps of homogenization at between 850° C. and 1030° C. for from one to 24 hours, hot rolling at a temperature of between 600° C. and 1000° C. and then quenching at a cooling rate of between 50° C. and 1000° C. per minute. These steps were followed by cold rolling up to 99% with one or two intervening bell anneals at a temperature of 350° C. to 500° C. for up to 10 hours (conventional BA process). Table 7B shows that with the conventional BA process, the silver containing alloy K007 had better bends. Bend evaluation of the alloys reported in Table 7B was by the V-block method.

Table 7B shows that better bends were obtained for alloys of the invention, K007 and K008, compared to commercial alloy K005 when both are processed either by a conventional bell anneal (BA) process or by a solution heat treatment (SHT) process. Better bend formability and isotropic values are obtained by the new process (SHT) relative to the conventional BA process.

Calculations supporting the rating as a function of the measured value illustrate that the achievement of the requirements by different alloys or tempers should be measurable.

For this purpose s-shaped mathematical functions can be used. The rating of the achievement should be low, e.g. 5%, at the disappointment limit. Close to the desirable property the rating should reach about 50% and should reveal a steep increase or decrease with small variations in the property measured. At the exaggeration limit the requirements are over-fulfilled. The rating should reach 95%. Further improvements can not improve customer satisfaction too much. Variations in property should only result in small variations of the rating.

We use a scaled arc tan-function $w(f(x))$ for this purpose. The function is bound to a lowest $(x_{min})$ and highest value $(x_{max})$ of the property of interest. Here the ratings $w(f(x))$ are set to zero or 100% respectively. Between these values for the rating $f(x)$ two points given will shape the s-function.

$$f(x) = 50 + (100/B) \cdot \arctan(c1 \cdot (x + c2))$$

The constants c1 and c2 are calculated from the two ratings set by $(x_1, f(x_1))$ and $(x_2, f(x_2))$. These settings being made by decision about the suitable characteristic of the rating.

$$w(f(x)) = w(f(x_{min})) + (w(f(x_{max})) - w(f(x_{min}))) \cdot (f(x) - f(x_{min}))/(f(x_{max}) - f(x_{min}))$$

Where x is the actual value of the property under scrutiny. $w(f(x))$ gives the rating for this property.

Holistic ratings for the entirety of properties are achieved by multiplying ratings of each property of interest with the designated value given by the QFD of its relative importance. These results are summed up and divided by the sum of all values of relative importance.

By this, the overall rating of performance is given by a percentage with respect to a completely exaggerated 100% solution. The ideal solution (focus) will reveal a result of about 50%. The overall rating is a useful tool to compare alloys and tempers on a most objective basis. Values utilized for multimedia applications are recited in Table 8 and for automotive applications in Table 9.

TABLE 7A

| Alloy | Process | YS Ksi | UTS Ksi | Elong. % | Cond. % IACS | 90° MBR/t GW/BW | % SR 150° C./ 1000 h |
|---|---|---|---|---|---|---|---|
| J310 | SHT | 81 | 82 | 3 | 77.3 | 1.2/1.2 | 14 |
| J306 | SHT | 78 | 80 | 3 | 78.2 | 1.2/0.8 | Not tested |
| K005 | BA | 72 | 81 | 10 | 86.6 | 1.6/2.6 | 30 |

TABLE 7B

| Alloy | Process | YS Ksi | UTS Ksi | Elong. % | Cond. % IACS | 90° MBR/t GW/BW | % SR 150° C./ 1000 h |
|---|---|---|---|---|---|---|---|
| K005 | BA | 78 | 84 | 10 | 84.5 | 1.7/4.0 | Not Tested |
| K007 | BA | 78 | 82 | 10 | 80.2 | 0.5/2 | Not Tested |
| K005 | SHT | 74 | 78 | 8 | 81.4 | 0.5/0.5 | 12 |
| K008 | SHT | 78 | 81 | 8 | 81.9 | 0/0 | 15 |

TABLE 8

QFD-Calculus for Multimedia-Applications

| Property | Settings | | | | | | | | Calculated Constants | | Adjusted Result | |
|---|---|---|---|---|---|---|---|---|---|---|---|---|
| | $X_1$ | f(x1) | X2 | f(x2) | xmin | xmax | w(f xmin) | w(f xmax) | c1 | c2 | X | w(f(x)) |
| Yield Strength (MPa) | 400 | 5 | 600 | 50 | 150 | 1000 | 0 | 100 | 0.03157 | −600 | 600 | 50.15 |
| Modulus Elasticity (GPa) | 90 | 5 | 130 | 50.0001 | 90 | 220 | 0 | 100 | 0.1578 | −130 | 130 | 48.51 |
| Bendability I (1) | 4 | 5 | 1 | 50.0001 | 0 | 5 | 100 | 0 | −2.105 | −1 | 1 | 56.31 |
| Bendability II (1) | 5 | 5 | 2 | 50.0001 | 0 | 6 | 100 | 0 | −2.105 | −2 | 2 | 52.06 |

TABLE 8-continued

QFD-Calculus for Multimedia-Applications

| Property | Settings | | | | | | | | Calculated Constants | | Adjusted Result | |
|---|---|---|---|---|---|---|---|---|---|---|---|---|
| | $X_1$ | f (x1) | X2 | f (x2) | xmin | xmax | w (f xmin) | w (f xmax) | c1 | c2 | X | w (f(x)) |
| Ultimate Tensile Strength (MPa) | 500 | 5 | 700 | 50.0001 | 300 | 1200 | 0 | 100 | 0.03157 | −700 | 700 | 49.74 |
| Stress relaxation (%) | 40 | 5 | 15 | 50.0001 | 2 | 70 | 100 | 0 | −0.2526 | −15 | 30 | 48.95 |
| Tolerance of Yield Strength (MPa) | 140 | 5 | 60 | 50.0001 | 10 | 100 | 100 | 0 | −0.07892 | −60 | 60 | 52.82 |
| Conductivity (% IACS) | 3 | 5 | 30 | 50.0001 | 1 | 80 | 0 | 100 | 0.2338 | −30 | 30 | 48.95 |

TABLE 9

QFD-Calculus for Automotive and Industrial Applications: Parameter

| Property | Settings | | | | | | | | Calculated Constants | | Adjusted Result | |
|---|---|---|---|---|---|---|---|---|---|---|---|---|
| | x1 | f (x1) | X2 | f (x2) | xmin | xmax | w (f min) | w (f xmax) | c1 | c2 | x | w (f(x)) |
| Yield Strength (MPa) | 300 | 5 | 550 | 50 | 150 | 1000 | 0 | 100 | 0.02526 | −550 | 550 | 49.82 |
| Stress relaxation 1 (%) | 10 | 50.0001 | 40 | 5 | 2 | 70 | 100 | 0 | −0.2105 | −10 | 10 | 59.04 |
| Stress relaxation 2 (%) | 15 | 50.0001 | 30 | 5 | 2 | 70 | 100 | 0 | −0.4209 | −15 | 15 | 52.36 |
| Modulus of Elasticity (GPa) | 100 | 5 | 200 | 95 | 90 | 220 | 0 | 100 | 0.1263 | −150 | 150 | 49.68 |
| Bendability I (1) | 0 | 95 | 1 | 5 | 0 | 5 | 100 | 0 | −12.63 | −0.5 | 0.5 | 52.35 |
| Bendability II (1) | 2 | 5 | 0 | 95 | 0 | 5 | 100 | 0 | −6.314 | −1 | 1 | 52.0 |
| Ultimate Tensile Strength (MPa) | 420 | 5 | 680 | 50.0001 | 250 | 1200 | 0 | 100 | 0.02428 | −680 | 680 | 49.72 |
| Conductivity (% IACS) | 40 | 5 | 75 | 50.0001 | 5 | 100 | 0 | 100 | 0.1804 | −75 | 75 | 52.45 |
| Tolerance of Yield Strength (MPa) | 140 | 5 | 50 | 50 | 10 | 200 | 100 | 0 | −0.07015 | −50 | 50 | 54.58 |

Table 10 illustrates that a copper alloy having the nominal desirable properties as recited in Table 2 has a QFD rating of 51. Table 11 illustrates that the copper alloy of Example 1 has a QFD value of 64 for multimedia applications and Table 12 illustrates the alloy has a QFD value of 54 for automotive and industrial applications.

It is apparent that there has been provided in accordance with this invention a copper alloy characterized by high strength and high electrical conductivity that is particularly suited for electrical connector applications that fully satisfies the objects, means and advantages set forth hereinbefore. While the invention has been described in combination with specific embodiments and examples thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

TABLE 10

ACHIEVEMENT EVALUATION - MULTIMEDIA APPLICATIONS

| Property | Parameter | Measured Value | Rating | Relative Importance | Performance |
|---|---|---|---|---|---|
| Y.S. | MPa | 600.00 | 50.15 | 1.0 | 50.15 |
| M. of E. | GPa | 130.00 | 48.51 | 0.8 | 38.81 |
| Bend I | MBR/t | 1.00 | 56.31 | 0.325 | 18.30 |
| Bend II | MBR/t | 2.00 | 52.06 | 0.325 | 16.92 |
| U.T.S. | MPa | 700.00 | 49.74 | 0.6 | 29.84 |
| S.R. | % Loss at 100° C./1000 hour | 15.00 | 54.03 | 0.5 | 27.02 |
| Conduct | % IACS | 30.00 | 48.95 | 0.4 | 19.58 |
| Y.S. Tolerance | MPa | 60.00 | 52.82 | 0.3 | 15.85 |

TABLE 10-continued

ACHIEVEMENT EVALUATION - MULTIMEDIA APPLICATIONS

| Property | Parameter | Measured Value | Rating | Relative Importance | Performance |
|---|---|---|---|---|---|
| | | | | Overall Performance | 216.46 |
| | | | | Maximum | 425.00 |
| | | | | Overall Rating | 51 |

Bend (Tables 1,2,10,11,12 are V-Block Method for 90° bend and forming punch method for 180° bend)
Performance = Rating × Relative Performance
Overall Performance = ΣPerformance
Maximum = Overall Performance when all Measured Values are Exaggerated, see Tables 1 and 2
Overall Rating = (Overall Performance/Maximum) × 100

TABLE 11

EXAMPLE 1
ALLOY EVALUATION - MULTIMEDIA APPLICATIONS

| Property | Parameter | Measured Value | Rating | Relative Importance | Performance |
|---|---|---|---|---|---|
| Y.S. | MPa | 580.00 | 31.33 | 1.0 | 31.33 |
| M. of E. | GPa | 145.00 | 88.70 | 0.8 | 70.96 |
| Bend I | MBR/t | 0.00 | 100.00 | 0.325 | 32.50 |
| Bend II | MBR/t | 0.80 | 94.85 | 0.325 | 30.83 |
| U.T.S. | MPa | 593.00 | 6.96 | 0.6 | 4.18 |
| S.R. | % Loss at 100° C./1000 hour | 6.00 | 95.72 | 0.5 | 47.86 |
| Conduct | % IACS | 79.00 | 99.94 | 0.4 | 39.98 |
| Y.S. Tolerance | MPa | 60.00 | 52.82 | 0.3 | 15.85 |
| | | | | Overall Performance | 273.47 |
| | | | | Maximum | 425.00 |
| | | | | Overall Rating | 64 |

TABLE 12

EXAMPLE 1 ALLOY EVALUATION - AUTOMOTIVE APPLICATIONS

| Property | Parameter | Measured Value | Rating | Relative Importance | Performance |
|---|---|---|---|---|---|
| Y.S. | MPa | 580.00 | 71.76 | 1.0 | 50.15 |
| S.R. I | % Loss 150°/1000 h | 13.00 | 36.75 | 0.55 | 38.81 |
| S.R. II | % Loss 200°/1000 h | 22.00 | 9.73 | 0.27 | 18.30 |
| M.E. | GPa | 145.00 | 49.68 | 0.66 | 16.92 |
| Bend I | MBR/t | 0.00 | 100.00 | 0.325 | 29.84 |
| Bend II | MBR/t | 0.80 | 82.59 | 0.325 | 27.02 |
| U.T.S | MPa | 593.00 | 11.68 | 0.59 | 19.58 |
| Conduct. | % IACS | 79.00 | 74.42 | 0.46 | 15.85 |
| Y.S. Tolerance | MPa | 50.00 | 54.58 | 0.46 | 25.11 |
| | | | | Overall Performance | 251.94 |
| | | | | Maximum | 462.70 |
| | | | | Overall Rating | 54 |

We claim:

1. A copper alloy, consisting of, by weight:

from 0.15% to 0.7% of chromium;

from 0.005% to 0.3% of silver;

from 0.01% to 0.15% of titanium;

from 0.01% to 0.10% of silicon;

up to 0.2% of iron;

up to 0.5% of tin;

optionally, from 0.001% to 0.1% of a deoxidizer selected from the group consisting of boron, lithium, calcium and the rare earth metals;

optionally, from 0.05% to 0.2% by weight, of magnesium;

optionally, at least a portion of the iron is replaced by cobalt on a 1:1 by weight basis and the balance copper and inevitable impurities wherein said copper alloy is essentially zirconium-free and has electrical conductivity of at least 75% IACS and a yield strength on the order of 80 ksi.

2. The copper alloy of claim 1, consisting of, by weight:

from 0.25% to 0.6% of chromium;

from 0.015% to 0.2% of silver;

from 0.01% to 0.08% of titanium;

from 0.01% to 0.10% of silicon;

less than 0.1% of iron;

up to 0.25% of tin; and the balance copper and inevitable impurities.

3. The copper alloy of claim 2 having a maximum of 0.065% of titanium.

4. The copper alloy of claim 2 having a minimum of 0.05% of titanium.

5. The copper alloy of claim 2, consisting of, by weight:

from 0.3% to 0.55% of chromium;

from 0.08% to 0.13% of silver;

from 0.02% to 0.065% of titanium;

from 0.02% to 0.05% of silicon;

from 0.03% to 0.09% of iron;

less than 0.05% of tin; and the balance copper and inevitable impurities.

6. The copper alloy of claim 1 wherein a ratio, by weight, of iron to titanium, Fe:Ti, is from 0.7:1 to 2.5:1.

7. The copper alloy of claim 6 where Fe:Ti is from 0.9:1 to 1.7:1.

8. The copper alloy of claim 6 wherein at least a portion of the iron is replaced with cobalt on a 1:1, by weight, basis.

9. The copper alloy of claim 1 formed into a wire.

10. The copper alloy of claim 1 having a Quality Function Deployment, QFD, value in excess of 50 for both automotive and multimedia applications.

11. The copper alloy of claim 1 further containing from 0.05% to 0.2%, by weight, of magnesium.

12. The copper alloy of claim 10 formed into an electrical connector.

13. The copper alloy of claim 12 wherein said electrical connector has a box shape.

14. The copper alloy of claim 10 formed into a leadframe.

15. The copper alloy of claim 1 formed into a rod.

* * * * *